United States Patent
Ager et al.

(10) Patent No.: US 7,592,930 B1
(45) Date of Patent: Sep. 22, 2009

(54) METHOD AND APPARATUS FOR REDUCING MEMORY USAGE BY ENCODING TWO VALUES IN A SINGLE FIELD

(75) Inventors: Mads Sig Ager, Laasby (DK); Lars Bak, Tranbjerg J. (DK); Kasper Verdich Lund, Hoejbjerg (DK)

(73) Assignee: Google Inc., Mountain View, CA (US)

( * ) Notice: Subject to any disclaimer, the term of this patent is extended or adjusted under 35 U.S.C. 154(b) by 0 days.

(21) Appl. No.: 12/120,085

(22) Filed: May 13, 2008

(51) Int. Cl.
  *H03M 7/00* (2006.01)
(52) U.S. Cl. .............. 341/50; 709/219; 707/103 R; 717/108
(58) Field of Classification Search .............. 341/50–60; 717/116, 108; 709/219; 707/103 R, 101
See application file for complete search history.

(56) References Cited

U.S. PATENT DOCUMENTS

| | | | |
|---|---|---|---|
| 5,852,664 A * | 12/1998 | Iverson et al. ............... | 705/51 |
| 6,920,461 B2 * | 7/2005 | Hejlsberg et al. ........ | 707/103 R |
| 7,028,287 B2 * | 4/2006 | Bak et al. ................... | 717/108 |
| 7,356,848 B1 * | 4/2008 | Duffield et al. ............. | 726/29 |

* cited by examiner

*Primary Examiner*—Lam T Mai
(74) *Attorney, Agent, or Firm*—Park, Vaughan & Fleming LLP

(57) ABSTRACT

One embodiment of the present invention provides a system that reduces memory usage by encoding two values in a single field. During operation, the system receives a string. After determining the length of the string, the system allocates a first set of bits in the single field to store the length of the string, where the size of this first set of bits depends upon the determined length of the string. The system then stores the length of the string in the first set of bits. Subsequently, the system computes a hash code for the string. The system then allocates a second set of bits from the remaining unallocated bits in the single field to store this hash code, and stores the hash code in this second set of bits. Thereafter, the system can access the string length value from the single field and can also use the entire single field as a hash value for the string.

20 Claims, 7 Drawing Sheets

METHOD AND APPARATUS FOR REDUCING MEMORY USAGE BY ENCODING TWO VALUES IN A SINGLE FIELD

BACKGROUND

1. Field of the Invention

The present invention relates to techniques for reducing memory usage in computing devices. More specifically, the present invention relates to a method and an apparatus for reducing memory usage by encoding two values in a single field.

2. Related Art

Many software programs include "strings" which comprise ordered sequences of symbols. Such strings are typically defined as structures in a programming language, and are stored as string objects in a runtime environment associated with the programming language. During program execution, a given program may manipulate these string objects, and also compute and store additional values related to a given string, such as the length of the string and a hash value for the string. In some systems, computing these additional values may not be optional, and re-computing the values may also be difficult (or even impossible). Hence, a system may store such values as part of the string object. For instance, the runtime environment may allocate additional fields for each string to store (and thereby avoid re-computing) such values. However, allocating multiple fields for each string can consume a substantial amount of memory for programs that include a large number of strings. This memory usage can become a problem for memory-constrained computing devices.

Hence, what is needed is a system that facilitates storing strings without the above-described problems.

SUMMARY

One embodiment of the present invention provides a system that reduces memory usage by encoding two values in a single field. During operation, the system receives a string. After determining the length of the string, the system allocates a first set of bits in the single field to store the length of the string, where the size of this first set of bits depends upon the determined length of the string. The system then stores the length of the string in the first set of bits. Subsequently, the system computes a hash code for the string. The system then allocates a second set of bits from the remaining unallocated bits in the single field to store this hash code, and stores the hash code in this second set of bits. Thereafter, the system can access the string length value from the single field and can also use the entire single field as a hash value for the string.

In some embodiments, the system stores the length of the string and the hash value in the single field such that the system can quickly look up either of the two values. By storing both values in the single field, the system reduces the number of fields needed to store the two values.

In some embodiments, the system uses a valid bit in the single field to indicate whether a hash code has been stored in the single field. For instance, the system may check this valid bit to ensure that the single field contains a valid hash code before attempting to use the single field as a hash value.

In some embodiments, (1) the value for the length of the string is stored in the most significant bits of the single field, (2) the hash code is stored in the next most significant bits of the single field, and (3) the valid bit is stored in the least significant bit of the single field. Hence, reading the length of the string from the single field involves shifting the contents of the single field to the right until the hash code and the valid bit are shifted out and only the first set of bits (representing the value of the length of the string) remain.

In some embodiments, decreasing the number of bits used to store the length of the string increases the number of bits available for the hash code, thereby improving the distribution of hash values for shorter strings.

In some embodiments, the system uses a defined string type for each given allocation of bits (between the bits for the length and the hash code) in the single field. The system can simultaneously use these multiple string types within a given program to enable a runtime environment to determine for each given string how many bits are used for the length of the string and the hash code for the string.

In some embodiments, the system uses all but one of the bits of the single field to store the value for the string length of a long string. In these embodiments, no hash code is computed for the string, and the one remaining unallocated bit in the single field is used as a valid bit that indicates whether the single field can be used as a valid hash value for the long string.

DETAILED DESCRIPTION

Figure 1:
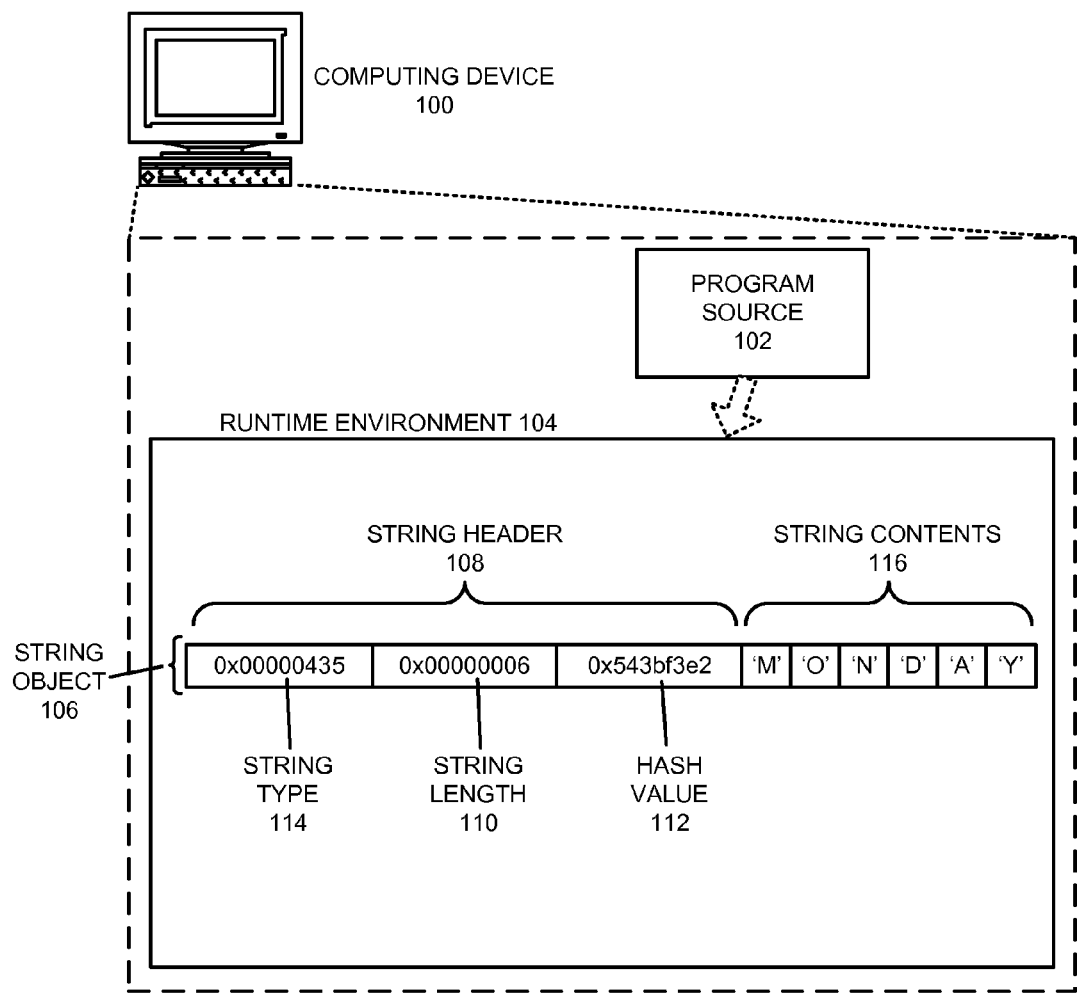
FIG. 1 illustrates an exemplary string object allocated by a program executing in a runtime environment on a computing device.

The following description is presented to enable any person skilled in the art to make and use the invention, and is provided in the context of a particular application and its requirements. Various modifications to the disclosed embodiments will be readily apparent to those skilled in the art, and the general principles defined herein may be applied to other embodiments and applications without departing from the spirit and scope of the present invention. Thus, the present invention is not limited to the embodiments shown, but is to be accorded the widest scope consistent with the principles and features disclosed herein.

The data structures and code described in this detailed description are typically stored on a computer-readable storage medium, which may be any device or medium that can store code and/or data for use by a computer system. The computer-readable storage medium includes, but is not limited to, volatile memory, non-volatile memory, magnetic and optical storage devices such as disk drives, magnetic tape, CDs (compact discs), DVDs (digital versatile discs or digital video discs), or other media capable of storing computer-readable media now known or later developed.

The methods and processes described in the detailed description section can be embodied as code and/or data, which can be stored in a computer-readable storage medium as described above. When a computer system reads and executes the code and/or data stored on the computer-readable storage medium, the computer system perform the methods and processes embodied as data structures and code and stored within the computer-readable storage medium.

Furthermore, the methods and processes described below can be included in hardware modules. For example, the hardware modules can include, but are not limited to, application-specific integrated circuit (ASIC) chips, field-programmable gate arrays (FPGAs), and other programmable-logic devices now known or later developed. When the hardware modules are activated, the hardware modules perform the methods and processes included within the hardware modules.

Strings in Programming Languages

Strings are frequently used in programming languages. For instance, programs written in programming languages such as JavaScript™ (the term JavaScript is a trademark of Sun Microsystems, Inc. of Santa Clara, Calif.) typically use a large number of strings, and hence create and manipulate a large number of string objects at runtime. Such programs may need to compute and quickly access one or more characteristics for each given string object. For instance, many programs frequently check the length of strings. Because calculating a string length typically involves a number of program instructions, programmers may design the runtime environment to only compute a string length once and store the computed length in a field associated with the string, thereby saving the string length for future re-use. Similarly, programs may compute and store for each given string a hash value that serves as an index into a hash table (e.g., when the string is used as a key in a dictionary lookup structure). Computing these hash values based on the content of the string often involves examining all of the characters in the string, and hence can be an expensive operation. By storing such hash values, a runtime environment ensures that the operation is only performed once and is not unnecessarily repeated multiple times, thereby improving performance.

Some programming language implementations store strings as a string header followed by the individual characters of the string. In such implementations, the string length and hash value may be stored in two separate fields in the header for a string object.

FIG. 1 illustrates an exemplary string object 106 allocated by a program executing in a runtime environment 104 on computing device 100. During operation, program source 102 for the program is loaded into runtime environment 104. Program source 102 defines and performs a number of operations upon string object 106. For instance, upon creating a string object with the characters "MONDAY", the runtime environment 104 allocates for string object 106 both a memory region that stores the actual string contents 116 (e.g., "MONDAY") as well as a string header 108 that includes: a string length 110 field; a hash value field 112; and a string type 114. In some systems, the runtime environment may already compute string length 110 and hash value 112 at the time the string is created. Alternatively, the runtime environment may delay the computation of these values until the first use.

Note that storing multiple values in separate fields can consume a substantial amount of memory when a large number of strings are allocated, which can be a problem for memory-constrained devices. One embodiment of the present invention reduces the memory used in a runtime environment by encoding the hash value for a string and the length of the string into a single field in the string header.

Encoding Two Values in a Single Field

In one embodiment of the present invention the system encodes a hash value and a string-length value for a string into a single field. By sharing a single field, instead of maintaining two separate fields for the two values, the system saves space in string headers while also ensuring efficient access to both the hash and string-length values. Note that this technique can be applied to the runtime implementation of any programming language.

Strings used in programs are typically short. For example, JavaScript™ programs typically include a large number of short strings (e.g., less than 256 characters in length), a smaller number of medium-size strings (e.g., under 65,536 characters in length), and very few long strings (e.g., 65,536 or more characters in length). Hence, if the runtime environment uses a 32-bit field to store string length, and strings shorter than 256 characters use at most 8 bits to represent the string length, many of the 32 bits in the field are not used for a majority of the strings. In one embodiment of the present invention, the bits used to store the string length and any remaining unused bits in the single field are used together as a hash value for the string.

Figure 2:
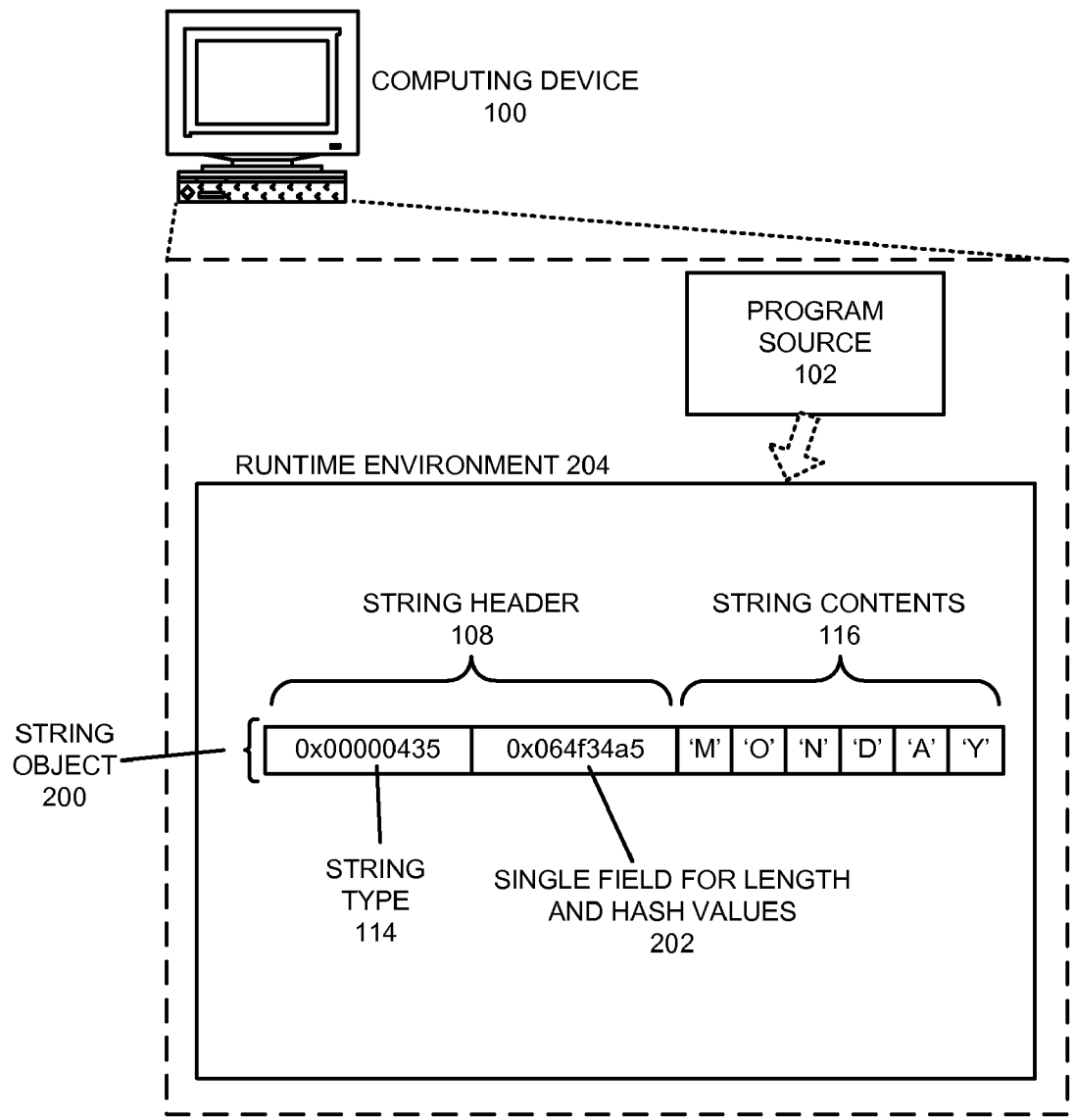
FIG. 2 illustrates an exemplary string object in which a runtime environment encodes two values in a single field in accordance with an embodiment of the present invention.

FIG. 2 illustrates an exemplary string object 200 in which runtime environment 204 encodes two values in a single field 202. As described previously for FIG. 1, program source 102 for the program is loaded into runtime environment 204 during operation, and defines and performs a number of operations upon string object 200. However, instead of allocating two fields for the string length and hash value (110 and 112 in FIG. 1), runtime environment 204 allocates only a single field for the length and hash values 202.

In one embodiment of the present invention, the programming language implementation (e.g., the runtime environment for the programming language) includes a number of string types that represent strings of different lengths (e.g., strings of short, medium and/or long length). Based on these string types, the runtime environment can determine a layout for the single field. Note that the described technique is not limited to three string types, but can instead include an arbitrary number of string types, as needed, depending on the distribution of string sizes and the number of bits available for the single field (e.g., different layouts for single fields that span 32 and/or 64 bits). The runtime environment uses the specified string type during execution to determine how to decode the string length from a given single field.

Figure 3:
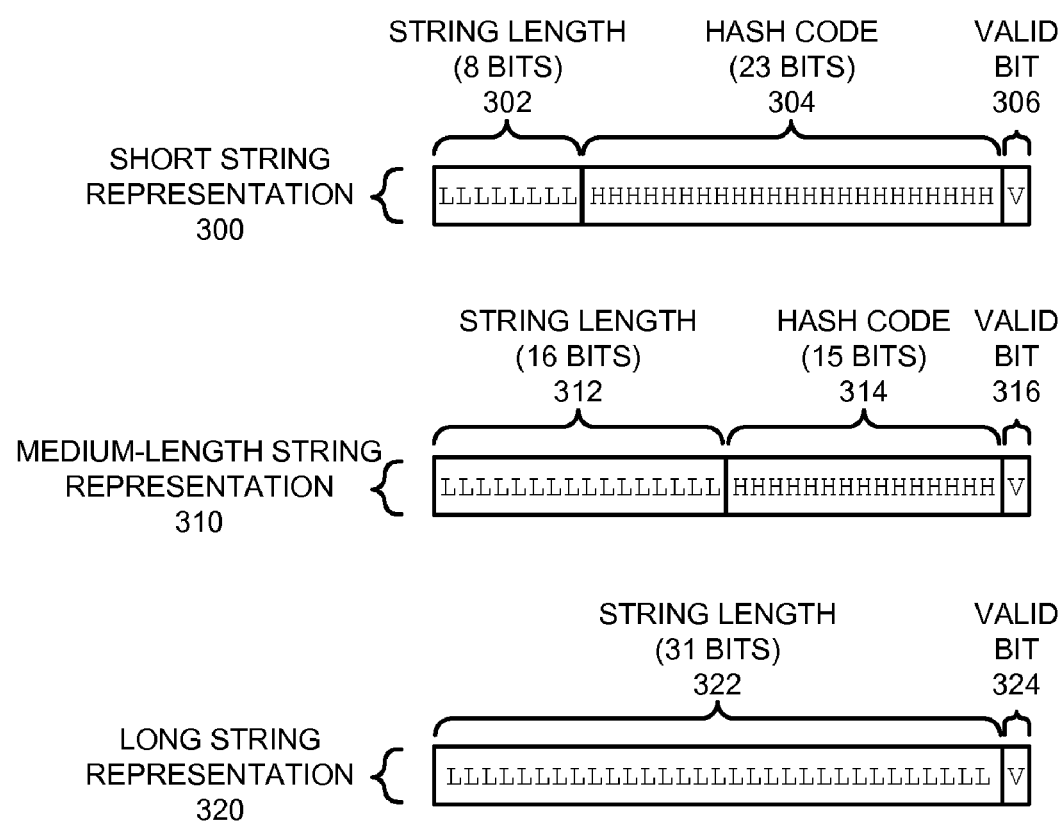
FIG. 3 illustrates three exemplary layouts for a single 32-bit field that can be used for three different categories of string lengths in accordance with an embodiment of the present invention.

FIG. 3 illustrates three exemplary layouts for a single 32-bit field that can be used for three different categories of string lengths. Note that in FIG. 3, (1) bits dedicated to storing string lengths are indicated by the letter 'L', (2) bits allocated to storing hash code bits are indicated by the letter 'H', and (3) a valid bit is indicated by the letter 'V'. Note also that a hash value associated with a given string comprises more than just the bits used for the hash code, but instead comprises all of the bits of the single field, including the bits that store the string length (as described below).

The system uses short string representation 300 for strings with a length less than 256 characters (which need 8 or fewer bits to represent the length of the string). Short string representation 300 stores string length 302 in the top (most-significant) eight bits of the single 32-bit field, leaving 24 bits unused. Short string representation 300 uses 23 of these remaining 24 bits to store a computed hash code 304 for the string, and uses the last (least-significant) bit (valid bit 306) to indicate whether a set of hash code bits have already been stored in the 23-bit hash code 304.

Figure 4A:
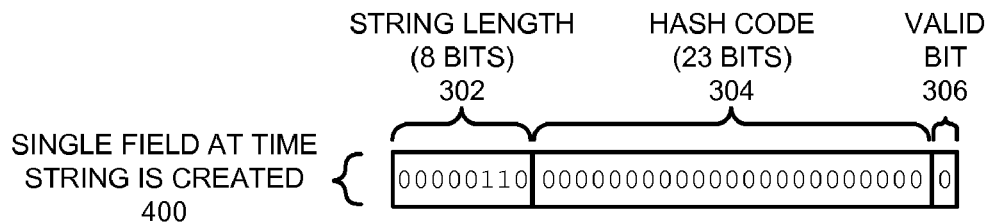
FIG. 4A illustrates an exemplary short representation of the single field for a string at the time the string is created in accordance with an embodiment of the present invention.

FIGS. 4A-4D illustrate the process of populating and using a single field associated with short string representation 300. When a short string (e.g., the string "MONDAY") is first created by a program, the runtime system determines the length of the string and writes this length (e.g., 6, or binary value "00000110") into the string length bits 302 as is shown in FIG. 4A. At this point, the remaining bits of the single field (e.g., hash code bits 304 and valid bit 306) remain blank (zero) (as shown in FIG. 4A).

Figure 4B:
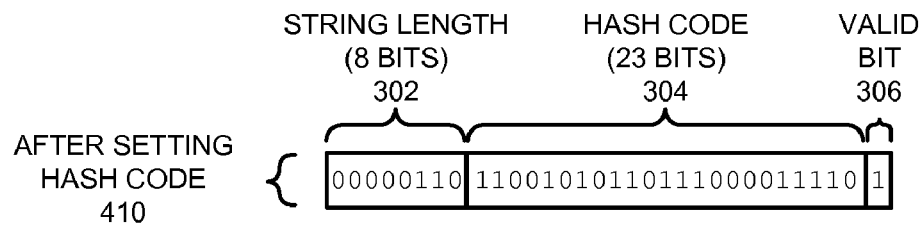
FIG. 4B illustrates an exemplary short representation of the single field for a string after the hash code bits have been set in accordance with an embodiment of the present invention.

Subsequently, when the system needs a hash code for the string, the system checks whether valid bit 306 is '1' ("valid") or '0' ("invalid"). If valid bit 306 indicates that hash code bits 304 are invalid for the given string (e.g., the system has not yet stored a hash code in hash code bits 304), the system: (1) computes a 23-bit hash code for the string; (2) sets hash code bits 304 in the single field for the string to the computed hash code value; (3) and sets valid bit 306 to valid ('1'). The content of the exemplary single field after setting a hash code 410 (with binary value "11001010110111000011110") is shown in FIG. 4B.

Figure 4C:
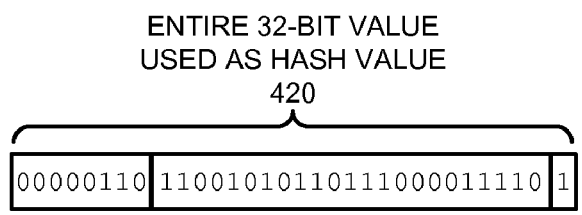
FIG. 4C illustrates the portion of an exemplary short representation of the single field for a string that is used as a hash value in accordance with an embodiment of the present invention.

Note, however, that while hash code bits 304 contain a computed hash code, the actual hash value used for the (short) string comprises the entire 32-bit value contained in the single field 420, including string length bits 302, hash code bits 304, and valid bit 306 (as shown in FIG. 4C). Because there are likely to be many short strings in a given program, using only string length as a hash value would be likely to result in collisions for short strings, but combining the string length with a computed hash code is likely to create a set of hash values that provide a good hash distribution. Furthermore, after the hash code bits 304 have been set to a valid value, accessing the hash value (e.g., as the entire single field) is as efficient as accessing a hash value stored in a separate field. Note that the hash function generating the hash code for the short (and medium-length) representation(s) can be customized to provide a good distribution for the hash values of strings in the system. For instance, the hash function may consider: the full or a partial set of characters in each string; the memory location of a string or a string header; the length of each string; an expected set of characteristics for one or more strings in the system; and/or other string and/or system characteristics. Note also that multiple string objects may hash to the same value (e.g., perhaps due to limitations in the system implementation, system environment, and/or hash function). For instance, in a system that cannot use the memory locations for strings in the hash function, string objects that contain the same characters may be considered equal and hash to the same value. The system may not ensure that string objects with different sequences of characters hash to different values, and in such (typically uncommon) cases may handle hash collisions using one or more collision management techniques.

Figure 4D:
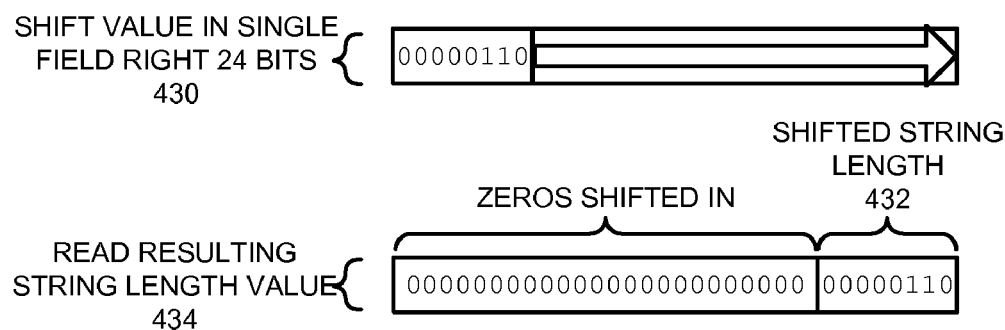
FIG. 4D illustrates the process of reading a string length from an exemplary short representation of the single field for a string in accordance with an embodiment of the present invention.

FIG. 4D illustrates the process of reading the length of a short string from a single field that uses the short string representation 300 illustrated in FIG. 3. To access the length of the short string, the system performs a right shift operation that shifts the value in the single field right 24 bits 430. After the right shift operation, the shifted string length bits 432 now comprise the least significant bits of the single field and zeros have been shifted into the most significant bits of the single field. Hence, the system can read the string length value 434 as an integer by performing a single shift operation. Because shift operations typically involve only a single simple instruction, accessing the string length from the single field is almost as efficient as accessing the string length from a separate field.

Besides illustrating the short string representation 300, FIG. 3 also illustrates a medium-length string representation 310. The system can use a medium-length string type for medium-sized strings with a length less than 65,536 characters. For such strings, the system stores a string length using 16 bits 312, and then uses 15 of the remaining 16 bits to store a computed hash code 314. As with short string representation 300, the last bit is used as a valid bit 316 that indicates whether or not a hash code has been stored already in the single field. Note that the process of accessing the hash value and string length for medium-length string representation 310 is substantially similar to accessing the two values for short string representation 300: the system can read the entire 32-bit single field as the hash value, or can shift string length bits 312 (this time by 16 bits, instead of 24 bits) to access the string length as an integer.

FIG. 3 also illustrates a long string representation 320. Note that there are typically very few strings with a length equal to or longer than 65,536 characters. For instance, a system that uses strings as keys for a dictionary lookup structure is unlikely to use a 65,000+ character string as a key for such a dictionary lookup structure. Because two of such long, rare strings are statistically unlikely to have exactly the same length, the system uses 31 bits of the single field to store the string length 322. The system uses the one remaining unallocated bit in the single field as a valid bit 324 that indicates whether the single field can be used as a valid hash value for the long string. Note that including valid bit 324 in long string representation 320 makes access to the hash value uniform for all string objects. Note also that although long strings with the same length will have the same hash value, the low likelihood of encountering two long strings with equal lengths means that the lengths of long strings typically provide a good hash distribution (for long strings). Furthermore, any actual collisions can be managed using a collision management technique without affecting the performance of the common case (e.g., shorter strings).

Note that the three string representations illustrated in FIG. 3 save memory while providing a reasonable distribution of hash values for the full set of strings in a program. This is achieved for shorter strings by storing hash codes in bits not needed to store length information. The typical distribution of string lengths in programs works in conjunction with the described string representations to ensure that the hash values of short strings and medium-length strings are well distributed by the combination of the string length and hash code fields, while the hash distribution for long strings is also well distributed by the low likelihood of multiple long strings having the same length. Note that while the memory savings gained by combining the two values into the single field may sometimes be small for long strings (due to the infrequency of long strings), the memory savings resulting from combining the two values for the (typically) large number of short and medium-length strings can be substantial. Even though the memory savings may not be as significant for longer strings, combining the two values in long representation 320 facilitates using uniform access techniques for string length across the full range of string objects (e.g., using a shift operation to access string length for all types of string objects).

Figure 5:
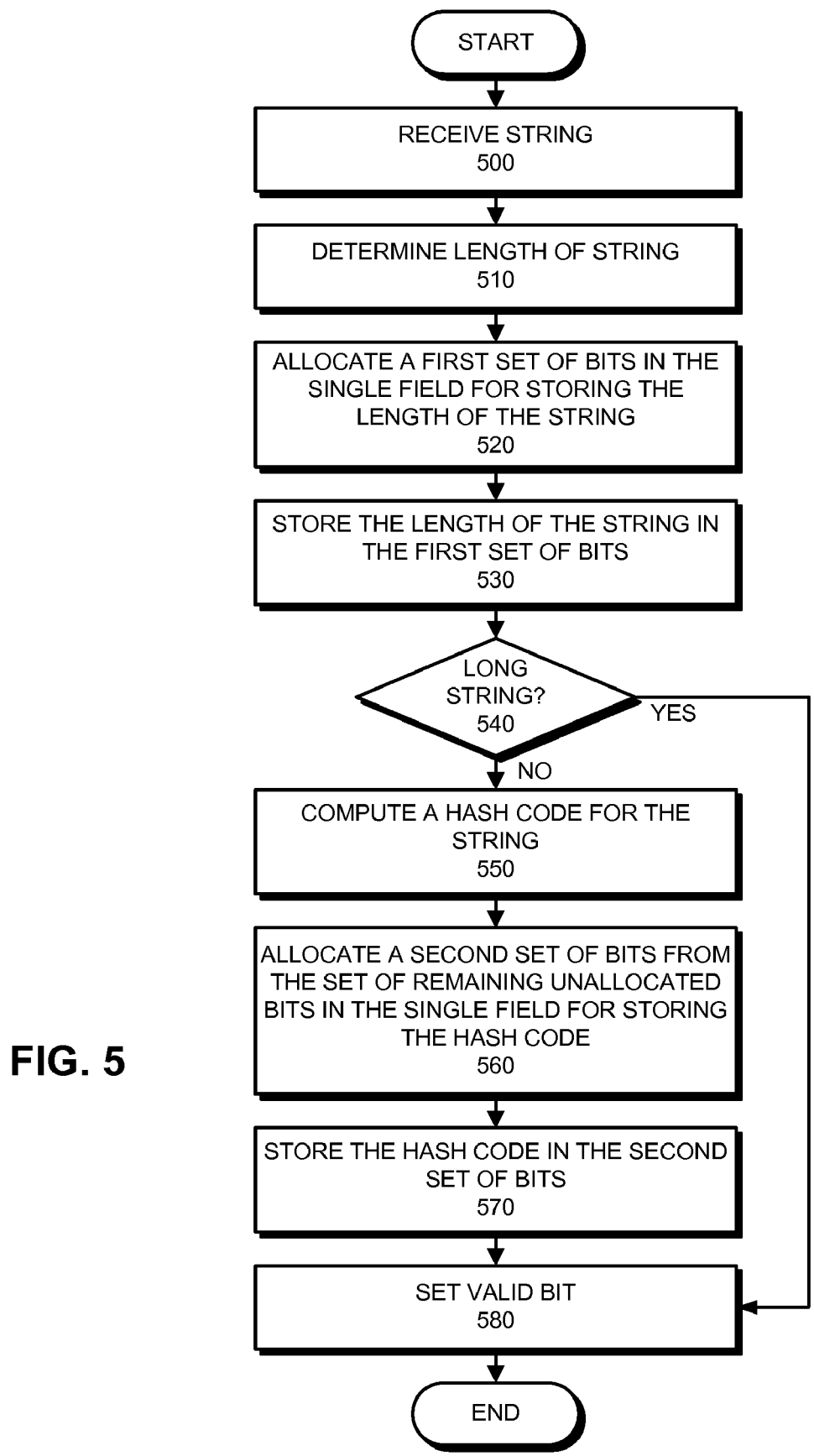
FIG. 5 presents a flow chart illustrating the process of encoding two values in a single field in accordance with an embodiment of the present invention.

FIG. 5 presents a flow chart illustrating the process of encoding two values in a single field. During operation, the system receives a string (operation 500). After determining the length of the string (operation 510), the system allocates a set of bits in the single field based on the length of the string (operation 520). The system stores the string length in these bits (step 530). Subsequently, the system determines that a hash value is needed for the string. Note that the timeframe for determining and storing this hash value may vary. For instance, the system may already compute the hash value at the time of string creation if it knows that a hash value will be needed for the string, or the system may instead wait to compute a hash value for the string until the system is sure that this hash value will indeed be needed. Regardless, at the time the system creates such a hash value, the system first determines whether or not the string is a long string (operation 540). If so, the system determines that all but one of the bits in the single field have been used to store a value for the string length, and that no hash code is needed. In this case, the system sets the valid bit to indicate that the single field can now be used as a hash value (operation 580), and the process completes. If the string is not a long string, the system computes a hash code for the string (operation 550). The system then allocates a second set of bits from the remaining unallocated bits in the single field for storing this hash code (operation 560) and proceeds to store the hash code in this second set of bits (operation 570). Finally, the system sets a valid bit to indicate that the single field can now be used as a hash value (operation 580).

Note that a system that always computes and stores hash codes in unallocated bits of the single field (when unallocated bits are available) at the time of string creation may not need to allocate and set a valid bit. For example, if the system is assured that the hash values are always valid (from the time the string is created), it can proceed to use the hash value without needing to set and/or check a valid bit.

Figure 6:
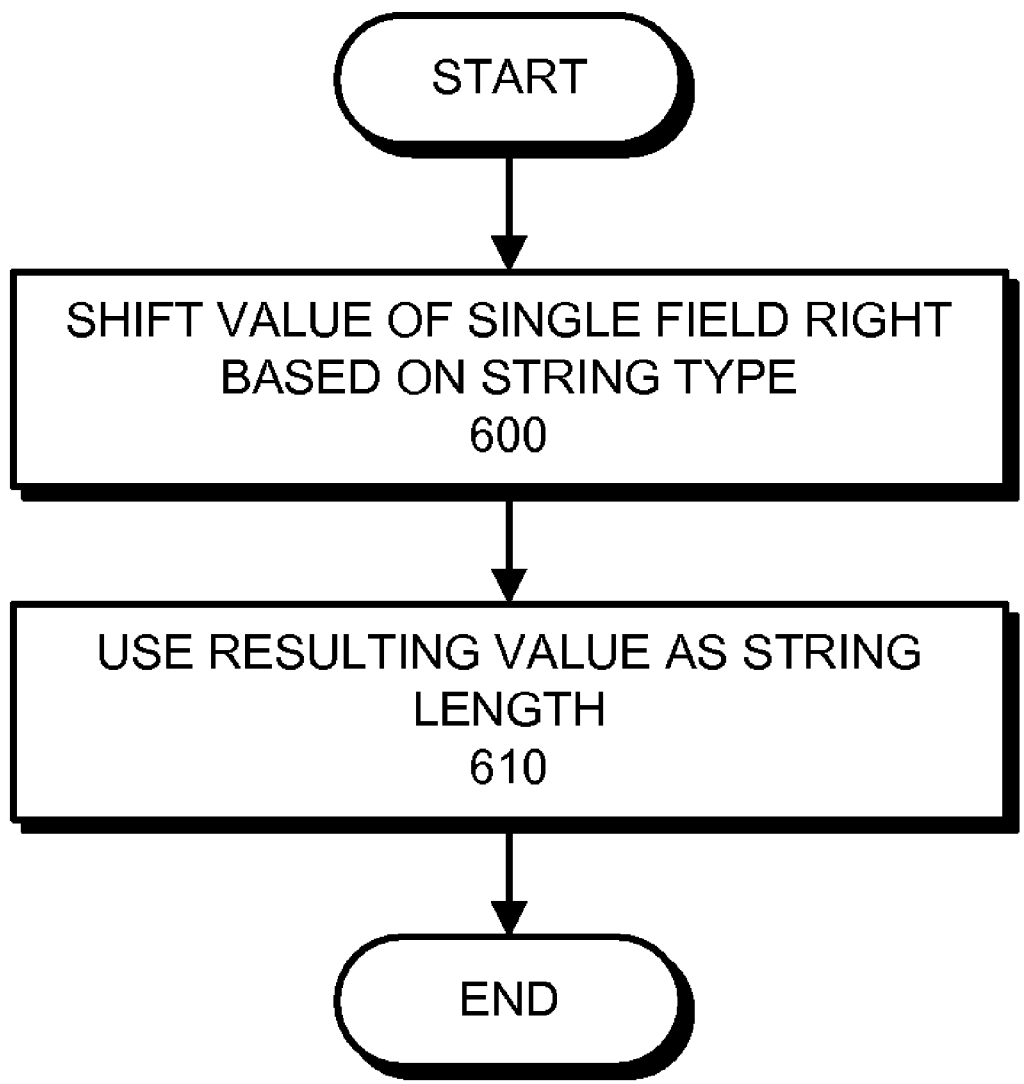
FIG. 6 presents a flow chart illustrating the process of reading the value for the string length from the single field in accordance with an embodiment of the present invention.

FIG. 6 presents a flow chart illustrating the process of reading the value for the string length from the single field. First, the system shifts the value of the single field right a specified number of bits based on the string type (e.g., 24 bits right for short strings, 16 bits right for medium-length strings, and one bit right for long strings) (operation 600). Note that the system may determine this string type implicitly. For instance, if the steps used to calculate the string length are associated with each specific string type, the system simply performs the operations for the given string type, and does not need to explicitly check the string type. After performing the shift, the system then reads the resulting value as the string length (operation 610). Hence, the system can efficiently access the string length by executing a shift instruction followed by a load instruction.

Figure 7:
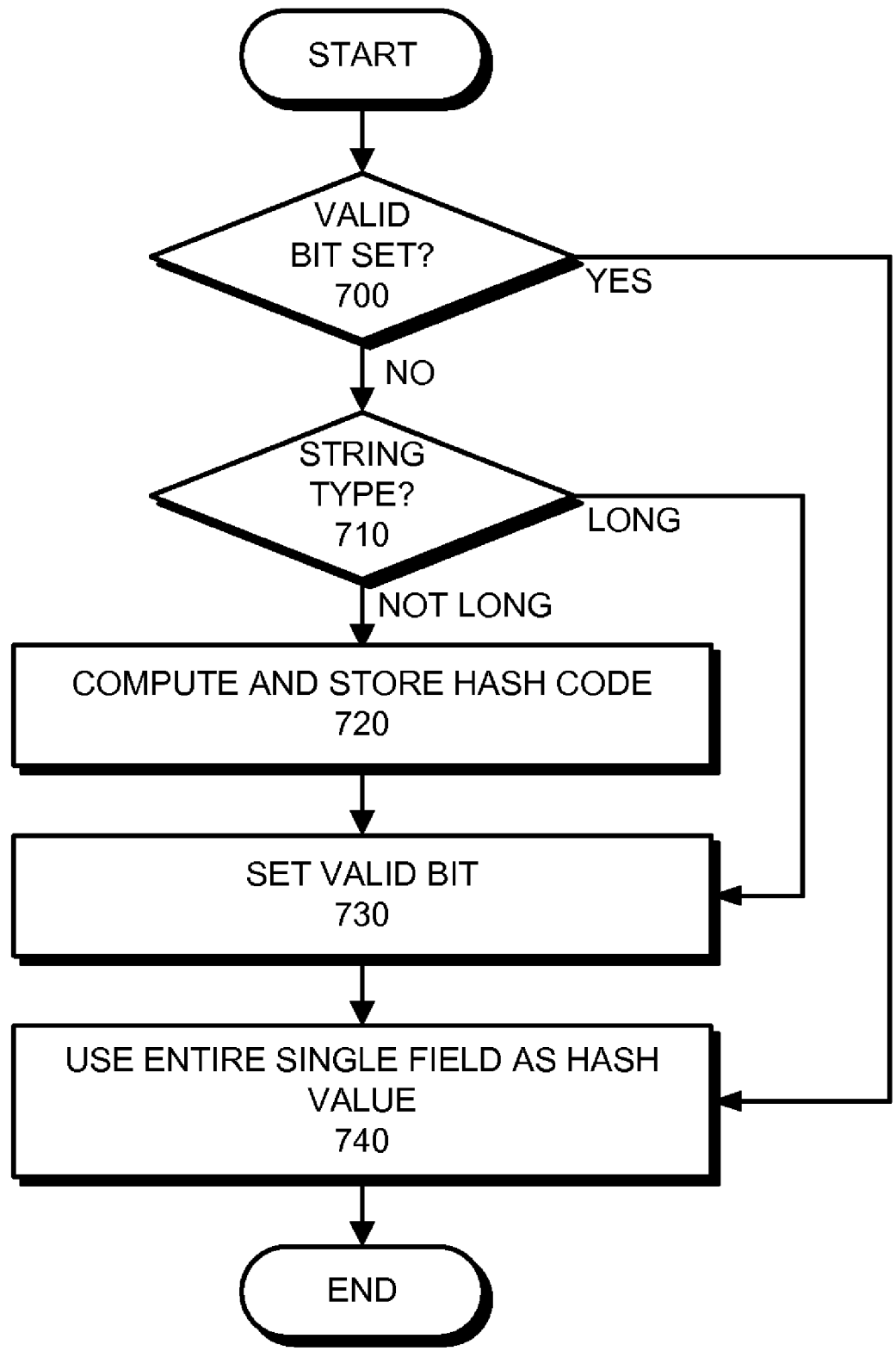
FIG. 7 presents a flow chart illustrating the process of reading a hash value for the string from the single field in accordance with an embodiment of the present invention.

FIG. 7 presents a flow chart illustrating the process of reading a hash value for the string from the single field. First, the system checks whether the valid bit for the single field has been set (operation 700). If so, the system proceeds to use the entire single field as the hash value (operation 740). If not, the system checks the string type for the string object (operation 710). If the string is of the long string type, the system does not need to compute a hash code, and proceeds to set the valid bit (operation 730) and use the entire single field as the hash value (operation 740). If the string is not of the long string type (in operation 710), the system computes and stores an additional hash code in the single field (as described for FIG. 5) (operation 720), sets the valid bit (operation 730), and then uses the entire single field as a hash value (operation 740). Note that a technique that uses the entire single field as the hash value and involves minimal checks is very beneficial for performance-sensitive program paths that need to efficiently access cached hash codes (for instance, programs that use a stub code cache as described in patent application GGL-1462-00-US, entitled "Supporting Efficient Access to Object Properties in a Dynamic Object-Oriented Programming Language," by Kasper Verdich Lund and Lars Bak, having Ser. No. 12/120,077, and filing date May 13, 2008, which is included by reference). The system does not need to separate out the bits used for string length, but can instead read the entire field as the hash value in a single instruction. As noted previously for FIG. 6, the process illustrated in FIG. 7 differs slightly depending on the string object's string type, but may not involve additional instructions that actually check the string type (as described below).

Note that the described techniques can be managed completely by a compiler and/or runtime environment for a given programming language, and can hence be transparent to programmers writing programs in the given programming language. The compiler and/or runtime environment can determine and remember the string type of each given string object, and ensure that the correct operations are performed when accessing the string length and hash value for each given string. For instance, for systems that use map objects to determine string types and properties (as described in patent application GGL-1461-00-US, entitled "Using Map Objects to Access Object Properties in a Dynamic Object-Oriented Programming Language," by Lars Bak and Kasper Verdich Lund, having Ser. No. 12/120,067, and filing date May 13, 2008, which is included by reference), the system may use different map objects for short, medium-length, and long strings. Hence, the system may use the map object associated with each given string to automatically determine the string type and corresponding single field access methods for the string type. As mentioned previously, because each object in the system is already associated with a type anyway, creating several additional types and looking up a set of additional types for distinguishing different representations of string objects typically does not involve any additional overhead.

Note that many runtime environments make strings immutable (e.g., string objects are never changed after they are created). Programs typically change strings infrequently, but when such a change occurs such systems typically create a whole new string object with a new string length and hash value. Similarly, such systems often also create a new string object when two strings are concatenated. Hence, for such systems, string lengths and hash values never need to be re-computed or changed, but instead are only written once (e.g., at the time the string object is created, or at the time the value is first used) and then subsequently are only read.

In some embodiments of the present invention, the bit layout of different string representations may vary. For instance, one embodiment of the present invention uses a different bit (other than the least-significant bit) of the single field to indicate whether a hash code has been cached for the string. In another embodiment, the single field is not a 32-bit value, but instead can have any number of bits. Furthermore, the number of internal string types, and therefore how bits in the single field are allocated between the string length and hash code fields, may vary. Also, while using the most significant bits of the single field to store the string length enables the system to retrieve the string length using a single shift operation, some alternative embodiments may store the string length in a different set of bits. For instance, the system can store the string length as the least significant set of bits, and perform a masking operation to separate the string length from the set of bits used for the hash code.

In one embodiment of the present invention, the system dynamically selects and adjusts the string representations for the single field during operation. For instance, the system can track string use during operation, and then adjust the set of string types and string representations based on the actual distribution of string lengths and the distribution of hash values for the string objects.

In summary, one embodiment of the present invention encodes two values in a single field. The system creates compact string headers that use a single field in the string header to hold both a string length value for the string as well as a hash value for the string. Depending on the length of a string, the system may use up to all but one of the bits of the single field to store the string length. The system can use a set of bits not used for storing the string length (e.g., for shorter strings) to store a hash code, and then uses the entire single field as a hash value for the string. The typical distribution of string lengths in programs works in conjunction with the described string representations to insure that the hash values of short strings are well distributed by the combination of the string length and hash code fields, while the hash distribution for long strings is also well distributed by the low likelihood that multiple long strings will have the same length. Hence, the system saves memory space by reducing the size of the string header without incurring significant additional compute overhead.

Note that while one embodiment of the present invention combines a string length value and a hash value into a single field, the described technique can also be used to combine two fields for other purposes as well.

The foregoing descriptions of embodiments of the present invention have been presented only for purposes of illustration and description. They are not intended to be exhaustive or to limit the present invention to the forms disclosed. Accordingly, many modifications and variations will be apparent to practitioners skilled in the art. Additionally, the above disclosure is not intended to limit the present invention. The scope of the present invention is defined by the appended claims.

What is claimed is:

1. A method for reducing memory usage by encoding two values in a single field, comprising:
   receiving a string;
   determining a length of the string;
   allocating a first set of bits in the single field for storing the length of the string, wherein a size of the first set of bits depends upon the length of the string;
   storing the length of the string in the first set of bits;
   computing a hash code for the string;
   allocating a second set of bits in the single field for storing the hash code, wherein the second set of bits is allocated from bits which remain in the single field after the first set of bits has been allocated; and
   storing the hash code in the second set of bits.

2. The method of claim 1, wherein the single field is used as a hash value for the string.

3. The method of claim 2,
   wherein storing the length of the string and the hash value in the single field enables fast lookups for a two values; and
   wherein storing the length of the string and the hash value in the single field reduces a number of fields needed to store the two values.

4. The method of claim 2,
   wherein a valid bit in the single field is used to indicate whether the hash code has been stored in the single field; and
   the method further comprises checking the valid bit before using the hash value to ensure that the single field contains a valid hash value.

5. The method of claim 4,
   wherein the first set of bits comprise the most-significant bits of the single field, the second set of bits comprise the next-most-significant bits of the single field, and the valid bit comprises the least-significant bit of the single field; and
   the method further comprising reading the length of the string from the single field involves shifting a contents of the single field such that the second set of bits and the valid bit are eliminated and only the first set of bits remain as the least significant bits of the single field.

6. The method of claim 5, further comprising decreasing the number of bits used to store the length of the string increases the number of bits available for the hash code, thereby improving a distribution of hash values for shorter strings.

7. The method of claim 6,
   wherein a string type is defined for each given allocation of bits in the single field between the first set of bits and the second set of bits;
   wherein multiple string types can be used simultaneously within a given program; and
   wherein the string types are used by a runtime environment to determine how many bits to use for the length of the string and the hash code for the string.

8. The method of claim 4,
   wherein for a long string of the first set of bits comprises all but one of the bits of the single field, the second set of bits is empty, and no hash code is computed for the string; and
   wherein a one remaining unallocated bit in the single field is used as the valid bit that indicates whether the single field can be used as the valid hash value for the long string.

9. A computer-readable storage medium storing instructions that when executed by a computer cause the computer to perform a method for reducing memory usage by encoding two values in a single field, the method comprising:
   receiving a string;
   determining a length of the string;
   allocating a first set of bits in the single field for storing the length of the string, wherein a size of the first set of bits depends upon the length of the string;
   storing the length of the string in the first set of bits;
   computing a hash code for the string;
   allocating a second set of bits in the single field for storing the hash code, wherein the second set of bits is allocated from bits which remain in the single field after the first set of bits has been allocated; and
   storing the hash code in the second set of bits.

10. The computer-readable storage medium of claim 9, wherein the single field is used as a hash value for the string.

11. The computer-readable storage medium of claim 10,
   wherein storing the length of the string and the hash value in the single field enables fast lookups for a two values; and
   wherein storing the length of the string and the hash value in the single field reduces a number of fields needed to store the two values.

12. The computer-readable storage medium of claim 10,
wherein a valid bit in the single field is used to indicate whether the hash code has been stored in the single field; and the method further comprises checking the valid bit before using the hash value to ensure that the single field contains a valid hash value.

13. The computer-readable storage medium of claim 12,
wherein the first set of bits comprise the most-significant bits of the single field, the second set of bits comprise the next-most-significant bits of the single field, and the valid bit comprises the least-significant bit of the single field; and the method further comprising reading the length of the string from the single field involves shifting a contents of the single field such that the second set of bits and the valid bit are eliminated and only the first set of bits remain as the least significant bits of the single field.

14. The computer-readable storage medium of claim 13, further comprising decreasing the number of bits used to store the length of the string increases the number of bits available for the hash code, thereby improving a distribution of hash values for shorter strings.

15. The computer-readable storage medium of claim 14,
wherein a string type is defined for each given allocation of bits in the single field between the first set of bits and the second set of bits;

wherein multiple string types can be used simultaneously within a given program; and wherein the string types are used by a runtime environment to determine how many bits to use for the length of the string and the hash code for the string.

16. The computer-readable storage medium of claim 12,
wherein for a long string of the first set of bits comprises all but one of the bits of the single field, the second set of bits is empty, and no hash code is computed for the string; and wherein a one remaining unallocated bit in the single field is used as the valid bit that indicates whether the single field can be used as the valid hash value for the long string.

17. An apparatus that reduces memory usage by encoding two values in a single field, comprising:

a receiving mechanism configured to receive a string;

a determining mechanism configured to determine a length of the string;

an allocation mechanism configured to allocate a first set of bits in the single field for storing the length of the string, wherein the size of the first set of bits depends upon the length of the string;

a storage mechanism configured to store the length of the string in the first set of bits;

a computation mechanism configured to compute a hash code for the string;

wherein the allocation mechanism is further configured to allocate a second set of bits in the single field for storing the hash code, wherein the second set of bits is allocated from bits which remain in the single field after the first set of bits has been allocated; and wherein the storage mechanism is further configured to store the hash code in the second set of bits.

18. The apparatus of claim 17, wherein the single field is used as a hash value for the string.

19. The apparatus of claim 18,
wherein storing the length of the string and the hash value in the single field enables fast lookups for a two values; and wherein storing the length of the string and the hash value in the single field reduces a number of fields needed to store the two values.

20. The apparatus of claim 18,
wherein a valid bit in the single field is used to indicate whether the hash code has been stored in a single field; and the apparatus further comprises a checking mechanism configured to check a valid bit before using the hash value to ensure that the single field contains a valid hash value.

* * * * *

UNITED STATES PATENT AND TRADEMARK OFFICE
CERTIFICATE OF CORRECTION

PATENT NO. : 7,592,930 B1
APPLICATION NO. : 12/120085
DATED : September 22, 2009
INVENTOR(S) : Mads Sig Ager et al.

It is certified that error appears in the above-identified patent and that said Letters Patent is hereby corrected as shown below:

In claim 20 (at column 12, line 34), please replace the word "a" with the word --the-- so that the line reads: --whether the hash code has been stored in the single field;--.

In claim 20 (at column 12, line 37), please replace the word "a" with the word --the-- so that the line reads: --configured to check the valid bit before using the hash--.

Signed and Sealed this

Tenth Day of November, 2009

David J. Kappos
*Director of the United States Patent and Trademark Office*